(12) United States Patent
Kamei et al.

(10) Patent No.: US 6,707,742 B2
(45) Date of Patent: Mar. 16, 2004

(54) NONVOLATILE SEMICONDUCTOR MEMORY DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/377,699

(22) Filed: Mar. 4, 2003

(65) Prior Publication Data

US 2003/0174561 A1 Sep. 18, 2003

(30) Foreign Application Priority Data

Mar. 18, 2002 (JP) .................................. 2002-074598

(51) Int. Cl.$^7$ ................................................. G11C 7/02
(52) U.S. Cl. ................................. 365/210; 365/185.11
(58) Field of Search ............................... 365/210, 200, 365/185.05, 185.11

(56) References Cited

U.S. PATENT DOCUMENTS

| | | | |
|---|---|---|---|
| 5,280,446 A | * 1/1994 | Ma et al. | 365/185.15 |
| 5,408,115 A | 4/1995 | Chang | 257/324 |
| 5,422,504 A | 6/1995 | Chang et al. | 257/316 |
| 5,494,838 A | 2/1996 | Chang et al. | 999/43 |
| 5,969,383 A | 10/1999 | Chang et al. | 257/316 |
| 5,986,934 A | * 11/1999 | Kao et al. | 365/185.18 |
| 6,177,318 B1 | 1/2001 | Ogura et al. | 438/267 |
| 6,248,633 B1 | 6/2001 | Ogura et al. | 438/267 |
| 6,255,166 B1 | 7/2001 | Ogura et al. | 438/257 |

FOREIGN PATENT DOCUMENTS

| | | |
|---|---|---|
| JP | A 7-1618513 | 6/1995 |
| JP | B1 2978477 | 9/1999 |
| JP | A 2001-156188 | 6/2001 |

OTHER PUBLICATIONS

U.S. patent application Ser. No. 09/955,158, Kanai et al., filed Sep. 19, 2001.
U.S. patent application Ser. No. 09/955,160, Kanai et al., filed Sep. 19, 2001.
U.S. patent application Ser. No. 10/115,913, Kamei, filed Apr. 5, 2002.
U.S. patent application Ser. No. 10/115,956, Kamei, filed Apr. 5, 2002.
U.S. patent application Ser. No. 10/153,611, Owa, filed May 24, 2002.
U.S. patent application Ser. No. 10/153,686, Owa, filed May 24, 2002.
U.S. patent application Ser. No. 10/153,736, Owa, filed May 24, 2002.
U.S. patent application Ser. No. 10/157,896, Kamei et al., filed May 31, 2002.
U.S. patent application Ser. No. 10/157,897, Kamei et al., filed May 31, 2002.
U.S. patent application Ser. No. 10/193,066, Kanai, filed Jul. 12, 2002.
U.S. patent application Ser. No. 10/193,602, Kanai, filed Jul. 12, 2002.

(List continued on next page.)

Primary Examiner—Vu A. Le
(74) Attorney, Agent, or Firm—Oliff & Berridge, PLC

(57) ABSTRACT

A nonvolatile semiconductor memory device which reduces the characteristic difference depending on the cell position, occurring between a cell current from a regular memory cell and a reference cell current, has a regular cell array and a reference cell array. The regular cell array has M numbers of large blocks formed by dividing the regular cell array in a column direction. Each of the M numbers of large blocks has m numbers of small blocks formed by finely dividing each of the large blocks in the column direction. The number and arrangement of the reference memory cells within the reference cell array is coincident with the number and arrangement of the memory cells arranged in the small block as a minimum unit for cell-array manufacture process.

14 Claims, 11 Drawing Sheets

OTHER PUBLICATIONS

U.S. patent application Ser. No. 10/197,643, Kanai et al., filed Jul. 18, 2002.

U.S. patent application Ser. No. 10/197,644, Kamei, filed Jul. 18, 2002.

U.S. patent application Ser. No. 10/197,645, Natori, filed Jul. 18, 2002.

U.S. patent application Ser. No. 10/197,646, Kanai, filed Jul. 18, 2002.

U.S. patent application Ser. No. 10/197,668, Kanai, filed Jul. 18, 2002.

U.S. patent application Ser. No. 10/229,064, Kamei, filed Aug. 28, 2002.

U.S. patent application Ser. No. 10/246,486, Natori, filed Sep. 19, 2002.

U.S. patent application Ser. No. 10/246,665, Natori, filed Sep. 19, 2002.

U.S. patent application Ser. No. 10/246,708, Natori, filed Sep. 19, 2002.

U.S. patent application Ser. No. 10/246,727, Natori, filed Sep. 19, 2002.

U.S. patent application Ser. No. 10/323,921, Natori, filed Dec. 20, 2002.

Hayashi et al., "Twin MONOS Cell with Dual Control Gates", 2000 IEEE VLSI Technology Digest of Technical Papers.

Chang et al., "A New SONOS Memory Using Source–Side Injection for Programming", IEEE Electron Device Letters, vol. 19, No. 7, Jul. 1998, pp. 253–255.

Chen et al., "A Novel Flash Memory Device with S Plit Gate Source Side Injection and ONO Charge Storage Stack (SPIN)", 1997, VLSI Technology Digest, pp. 63–64.

U.S. patent application Ser. No. 09/955,160, Kanai et al., filed Sep. 19, 2001.

U.S. patent application Ser. No. 10/356,644, Kamei et al., filed Feb. 3, 2003.

U.S. patent application Ser. No. 10/361,573, Kamei et al., filed Feb. 11, 2003.

U.S. patent application Ser. No. 10/373,166, Kamei et al., filed Feb. 26, 2003.

U.S. patent application Ser. No. 10/377,707, Kamei et al., filed Mar. 4, 2003.

U.S. patent application Ser. No. 10/385,506, Kamei et al., filed Mar. 12, 2003.

U.S. patent application Ser. No. 10/385,661, Kamei, filed Mar. 13, 2003.

* cited by examiner

FIG. 2A
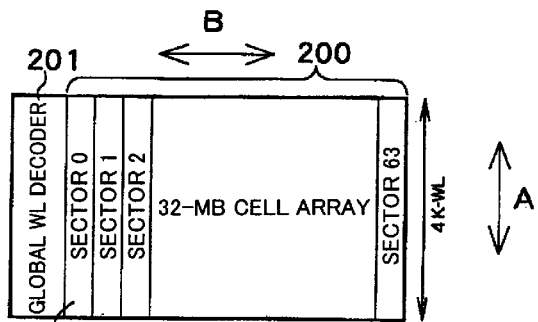
FIG. 2B
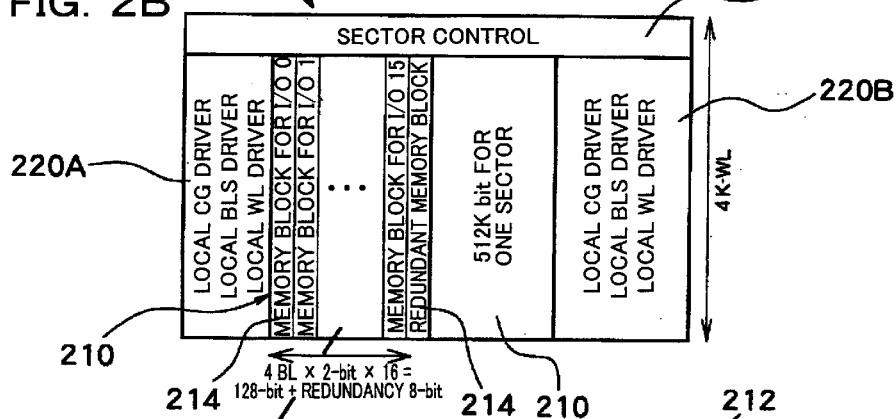
FIG. 2C
FIG. 2D
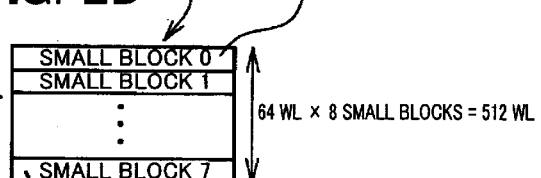
FIG. 2E
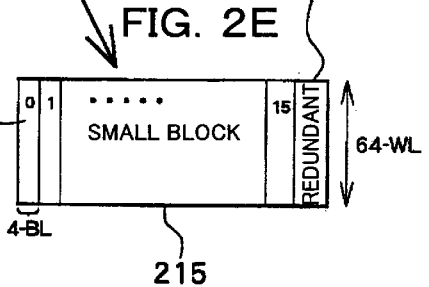
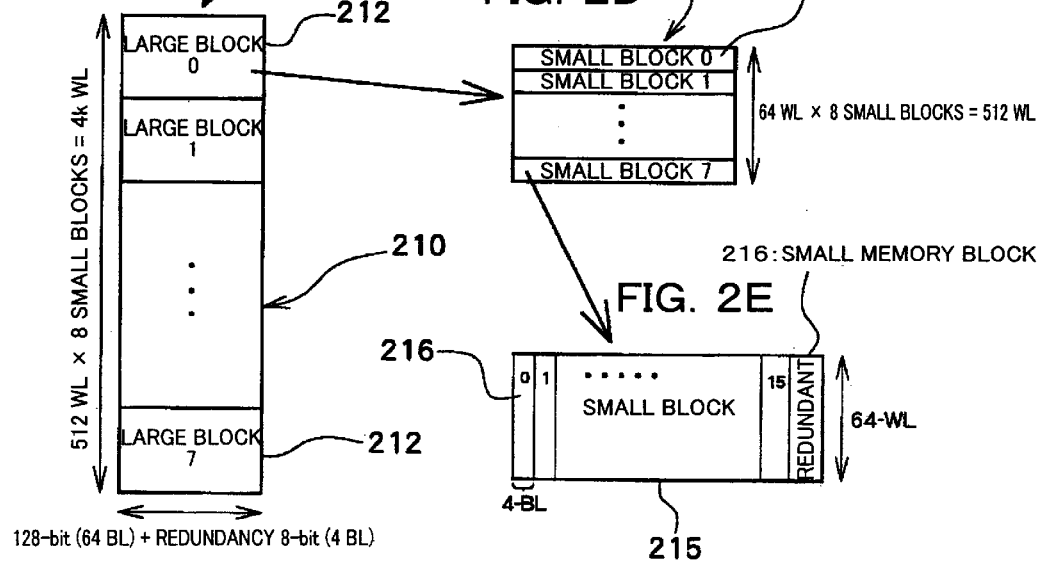

NONVOLATILE SEMICONDUCTOR MEMORY DEVICE

Japanese Patent Application No. 2002-74598, filed on Mar. 18, 2002, is hereby incorporated by reference in its entirety.

BACKGROUND OF THE INVENTION

The present invention relates to a nonvolatile semiconductor memory device having a reference cell array in addition to a regular cell array, respectively arranged with memory cells.

There is known as an example of a nonvolatile semiconductor memory device of the Metal-Oxide-Nitride-Oxide-Semiconductor or -Substrate (MONOS) type having, between the channel and the gate, a gate insulation film formed by the layers of a silicon oxide film, a silicon nitride film and a silicon oxide film, in order to trap charges in the silicon nitride film.

The MONOS-type nonvolatile semiconductor memory device is disclosed in a publication, Y. Hayashi, et al.: 2000 Symposium on VLSI Technology, Digest of Technical Papers, p. 122 to p. 123. This document discloses a MONOS flash memory having one word gate and two nonvolatile memory cells (also called MONOS memory cells) of under control of two control gates. Namely, one flash memory cell has two electron trap sites.

By arranging a plurality of such structured MONOS flash memory cells in row and column directions, a regular cell array is configured.

The operation of such a flash memory includes data erasure, programming and reading out. Data programming and reading out is simultaneously effected usually on 8 bits, 16 bits or 32 bits while data erasure is simultaneously on multiple bits.

During data reading, the cell currents, for example, from sixteen selected cells are inputted to sixteen sense amplifiers and compared with a reference current, thereby determining a memory state of each selected cell.

It can be considered that a constant reference voltage is set up in order to supply such a reference current. However, the location of sixteen selected cells changes every time depending upon address selection. Moreover, there is change in cell current characteristic depending upon a cell location due to the cause of manufacture. The cell current characteristic refers to temperature characteristic, voltage characteristic and so on. Accordingly, there possibly arises a case that the memory state of a selected cell cannot be correctly determined upon supplying a reference current to the sense amplifier on the basis of such constant reference voltage.

BRIEF SUMMARY OF THE INVENTION

The present invention may provide a nonvolatile semiconductor memory device having a reference cell array in addition to the regular cell array thereby reducing the characteristic variation between the cell currents to be simultaneously selected and read out by the both arrays and compared by a sense amplifier.

A nonvolatile semiconductor memory device according to the present invention has a regular cell array and a reference cell array. The regular cell array may be configured by arranging a plurality of memory cells in row and column directions, each of the memory cells having one word gate and first and second nonvolatile memory cells controlled by first and second control gates, respectively. The reference cell array may be configured by arranging a plurality of reference memory cells in the row and column directions, each of the reference memory cells having the same structure as each of the memory cells.

The regular cell array has M numbers of large blocks formed by dividing the regular cell array in the column direction, and each of the M numbers of large blocks has m numbers of small blocks formed by finely dividing each of the large blocks in the column direction. Each of the m numbers of small blocks becomes a minimum unit of manufacture process of cell array.

The number and arrangement of the reference memory cells within the reference cell array are coincident with number and arrangement of the memory cells arranged in each of the m numbers of small blocks as a minimum array unit within the regular memory cell.

This can approximate the positional dependence of the cells within the reference cell array to the positional dependence of the cells within the small block as a minimum array unit in the regular cell array.

The small block can be defined as follows. Each of the m numbers of small blocks may have a plurality of sub-bit lines extending along the column direction, and each of the sub-bit lines may be commonly connected to the first and second nonvolatile memory cells that are adjacent each other in two of the memory cells adjacent in the row direction in each row. In this manner, the nonvolatile memory cells in the adjacent two columns within the small block may share one sub-bit line.

Another definition of the small block may be as follows. First, a plurality of main bit lines extending across the M numbers of large blocks along the column direction may be provided. M numbers of bit-line select switches may be arranged on each column, the bit line select switches selecting one of the m numbers of sub-bit lines positioned on the same column within each of the m numbers of small blocks and connecting the selected one of the sub-bit lines to one of the main bit lines. Regions of the two small blocks adjacent in the column direction may be demarcated by a formation region of each of the m numbers of bit-line select switches on each column.

A further definition of the small block may be as follows. Each of the m numbers of small blocks may have a plurality of sub-control gate lines extending along the column direction, and each of the sub-control gate lines may be commonly connected to the first and second control gates that are adjacent each other in two of the memory cells adjacent in the row direction in each row. In other words, the nonvolatile memory cells in the adjacent two columns within the small block may share one sub-control gate.

The designation for a selected cell in the regular cell array and reference cell array during data reading may be as follows. During the data reading, a low-level address from among row addresses and column addresses to be used for cell selection in the regular cell array, may be used to execute cell selection in the reference cell array. This is because the number and arrangement are equal between the cells arranged in one small block of the regular cell array and those in the reference cell array.

During data reading, one of the first and second nonvolatile memory cells in one of the memory cells may be designated as a selected cell and the other may be designated as an unselected opposite cell. At this time, a select voltage may be applied to one of the first and second control gates corresponding to the selected cell within the regular cell array and an override voltage may be applied to the other of the first and second control gates corresponding the unselected opposite cell. On the other hand, the select voltage may be applied to both of the selected cell and the unselected opposite cell of the reference memory cell within the reference cell array. This is because the reference memory cell has been set in an erased state upon factory shipment, and the reference memory cell does not require an override voltage for a control gate of a cell unknown in memory state.

The regular cell array may be divided in the row direction into n numbers of first memory blocks, one of the n numbers of first memory blocks being designated as a redundant memory block. Similarly, the reference cell array may be divided in the row direction into n numbers of second memory blocks, one of the n numbers of second memory blocks being a reference redundant memory block.

In this case, the nonvolatile semiconductor memory device may further include: n numbers of sense amplifiers provided correspondingly to the n numbers of first memory blocks; a first path circuit which supplies cell current from the selected cell in each of the n numbers of first memory blocks to each of the n numbers of sense amplifiers; and a second path circuit which supplies reference cell current from the selected cell in each of the n numbers of second memory blocks to each of the n numbers of sense amplifiers.

Furthermore, the nonvolatile semiconductor memory device may further include: (n−1) numbers of data output terminals; and a multiplex circuit which selects outputs of (n−1) numbers of sense-amplifiers from among the n numbers of sense amplifiers and supplies the selected output of the (n−1) numbers of sense amplifier to the (n−1) numbers of output terminals, respectively. This eliminates the necessity of switching on a input-stage side of the sense amplifier, not causing access time change.

Each of the n numbers of first memory blocks and n numbers of second memory blocks may have four bit lines extending along the column direction, and the number of the memory cells arranged in the row direction may be determined as four in each of the n numbers of first memory blocks and each of the n numbers of second memory blocks. The four memory cells are a minimum unit for memory driving, making possible to minimize the area occupation ratio of the redundant memory block.

The regular cell array may have N numbers of sector regions formed by dividing the regular cell array in the row direction. In this case, each of the N numbers of sector regions may have the n numbers of first memory blocks. Also, each of the N numbers of sector regions may be connected with the first path circuit.

Each of the N numbers of sector regions can be provided as a unit for data erasure. In this case, a control gate drive section which drives each of the first and second control gates of each of the memory cells within the regular cell array may have N numbers of local control gate drivers corresponding to the N numbers of sector regions, respectively. Each of the N numbers of local control gate drivers may be capable of setting potentials of the first and second control gates in a corresponding one of the sector regions independently of the other sector regions. During data erasure, one of the N numbers of control gate drivers may be selected to supply an erasing high potential to the first and second control gates in one sector region selected from the N numbers of sector regions. In this manner, data can be erased for each of the sector regions.

Each of the first and second nonvolatile memory cells may include an ONO film formed of an oxide film (O), a nitride film (N) and an oxide film (O), as a charge trap site. However, the trap site structure is not limited to this.

BRIEF DESCRIPTION OF THE SEVERAL VIEWS OF THE DRAWINGS

FIG. 2A is a plan layout view of the overall nonvolatile semiconductor memory device shown in FIG. 1, FIG. 2B is a plan view of two sector regions of FIG. 2A, FIG. 2C is a plan view of one memory block of FIG. 2B, FIG. 2D is a plan view of one large block of FIG. 2C, and FIG. 2E is a plan view of one small block of FIG. 2D;

DETAILED DESCRIPTION OF THE EMBODIMENT

An embodiment of the present invention will now be explained with reference to the drawings.

Memory Cell Structure

Figure 1:
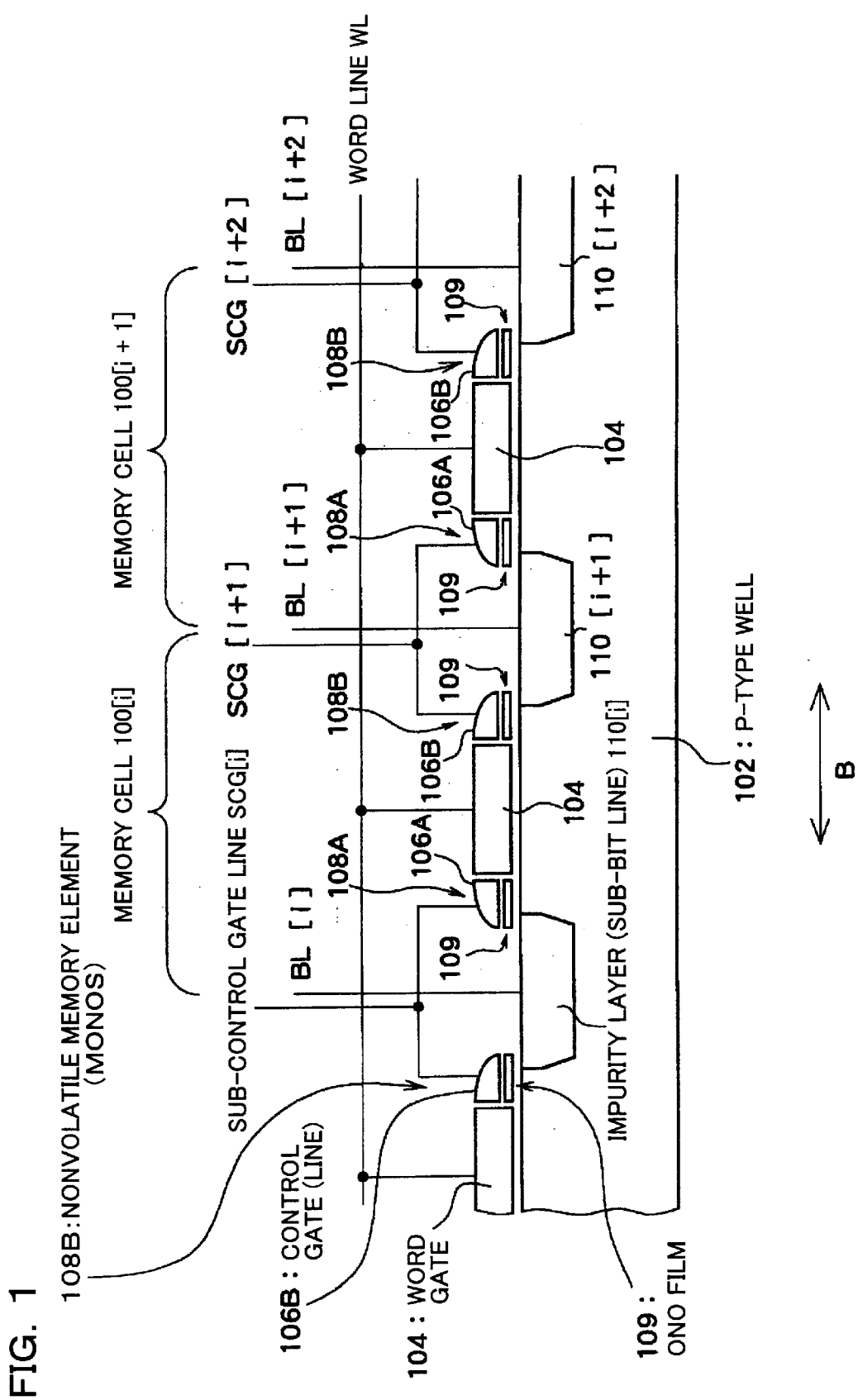
FIG. 1 is a sectional view of a memory cell to be used for a nonvolatile semiconductor memory device according to an embodiment of the present invention.

FIG. 1 shows a section of a nonvolatile semiconductor memory device. In FIG. 1, one memory cell 100 has a word gate 104 formed for example of a material containing polysilicon on a P-type well 102 through a gate oxide film, first and second control gates 106A and 106B, and first and second memory cells (MONOS memory cells) 108A and 108B.

The first and second control gates 106A and 106B are formed on the respective sidewalls of the word gate 104, which are electrically insulated from the word gate 104.

Each of the first and second memory cells 108A and 108B is structured by the layers of an oxide film (O), a nitride film (N) and an oxide film (O), between one of the first and second control gates 106A and 106B formed of polysilicon corresponding to M (metal) of MONOS and the P-type well 102. Note that the first and second control gates 106A and 106B can be structured of a conductive material, such as silicide.

In this manner, the one memory cell 100 has the first and second MONOS memory cells 108A and 108B having split gates (first and second control gates 106A and 106B). Thus, the one word gate 104 is shared by the first and second MONOS memory cells 108A and 108B.

The first and second MONOS memory cells 108A and 108B respectively serve as charge trap sites. Each of the first and second MONOS memory cells 108A and 108B can trap charges in an ONO film 109.

As shown in FIG. 1, a plurality of word gates 104 arranged with spacing in a row direction B are commonly connected to one word line WL formed of polycide or the like.

Meanwhile, the control gate 106A and 106B shown in FIG. 1 extends in a column direction (in a column direction A vertical in the page of FIG. 1), to be shared by a plurality of memory cells 100 arranged in the column direction. Accordingly, the reference 106A and 106B is also referred to as a control gate line.

Herein, a sub-control gate line SCG [i+1], formed for example by a metal layer in an upper level than the word gate, control gate and word line, is connected to the control gate line 106B of the [i]-th memory cell 100[i] and the control gate line 106A of the [i+1]-th memory cell 100[i+1].

In the P-type well 102, there is provided an [i+1]-th impurity layer 110[i+1] that is shared by the MONOS memory cell 108B of the [i]-th memory cell 100[i] and the MONOS memory cell 108A of the [i+1]-th memory cell 100[i+1].

The impurity layers 110[i], 110[i+1], 110[i+2] are n-type impurity layers formed in the P-type well. These impurity layers extend in a column direction (vertical in the page of FIG. 1) and serve as sub-bit lines shared by a plurality of memory cells 100 arranged in the column direction. Accordingly, the references 110[i], 110[i+1], 110[i+2] and the like are also referred to as sub-bit lines SBL[i], SBL[i+1] and SBL[i+2].

Overall Structure of Nonvolatile Semiconductor Memory Device

Explanation is made on the overall structure of a nonvolatile semiconductor memory device structured by using the above memory cells 100, with reference to FIGS. 2A to 2E.

FIG. 2A is a plan layout diagram of a 1-chip nonvolatile semiconductor memory device having a regular cell array 200 and a global word-line decoder 201. The regular cell array 200 has, for example, sixty-four, 0th to 63th, sector regions 210. FIG. 2A is on an example having the number of sectors N=64.

The sixty-four sector regions 210 are the divisions of the regular cell array 200 in the row direction B, as shown in FIG. 2A. Each sector region 210 has an elongate form having a lengthwise direction in the column direction A. Data erasure is based on the sector region 210 as a minimum unit. The storage data in the sector region 210 is erased in batch or by time division.

The memory array region 200 has, for example, 4K numbers of word lines WL and 4K numbers of bit lines BL. Herein, in this embodiment, because one bit line BL is connected with two MONOS memory cells 108A and 108B, the 4K numbers of bit lines BL signify a storage capacitance of 8K bits. Each sector region 210 has a storage capacitance of 1/64th of the total memory storage capacitance, i.e. having a storage capacitance as defined by (4K numbers of word lines) ? (64 bit lines BL) ? 2.

FIG. 2B shows a detail of adjacent two, 0th and 1st sectors 210 of the nonvolatile semiconductor memory device shown in FIG. 2A. As shown in FIG. 2B, there are arranged local driver regions (including local control gate driver, local bit line select driver and local word line select driver) 220A and 220B on the both sides of the two sector regions 210. Also, a sector control circuit 222 is arranged, for example, on an upper side of the two sectors 210 and two local driver regions 220A and 220B.

Each sector region 210 has totally seventeen (example of n=17) first memory blocks 214 formed by dividing the sector region 210 in the row direction B. Of these, the sixteen first memory blocks 214 are regular memory blocks arranged correspondingly to the I/O0 to I/O15 in the total number of 16 (n−1=16), to enable simultaneously reading/writing of 16-bit data. The remaining one of first memory block 214 is a redundant memory block. In case a defective cell be found in any one of the 16 regular memory blocks 214, the redundant memory block 214 is used in place of the regular memory block 214 including the defective cell. Note that (n−1) bits may be set as 1 byte (8 bits) or 1 double word (32 bits). Note that each first memory block 214 has 4K numbers of word lines WL (4096), as shown in FIG. 2B.

As shown in FIG. 2C, the one sector 210 shown in FIG. 2B is divided into eight (example of M=8) large blocks 212 in the column direction A. The large block 212 is divided into eight (example of m=8) small blocks 215 in the column direction A, as shown in FIG. 2D.

Each small block 215 has sixty-four word lines WL, as shown in FIG. 2E.

Sector Detail

Figure 3:
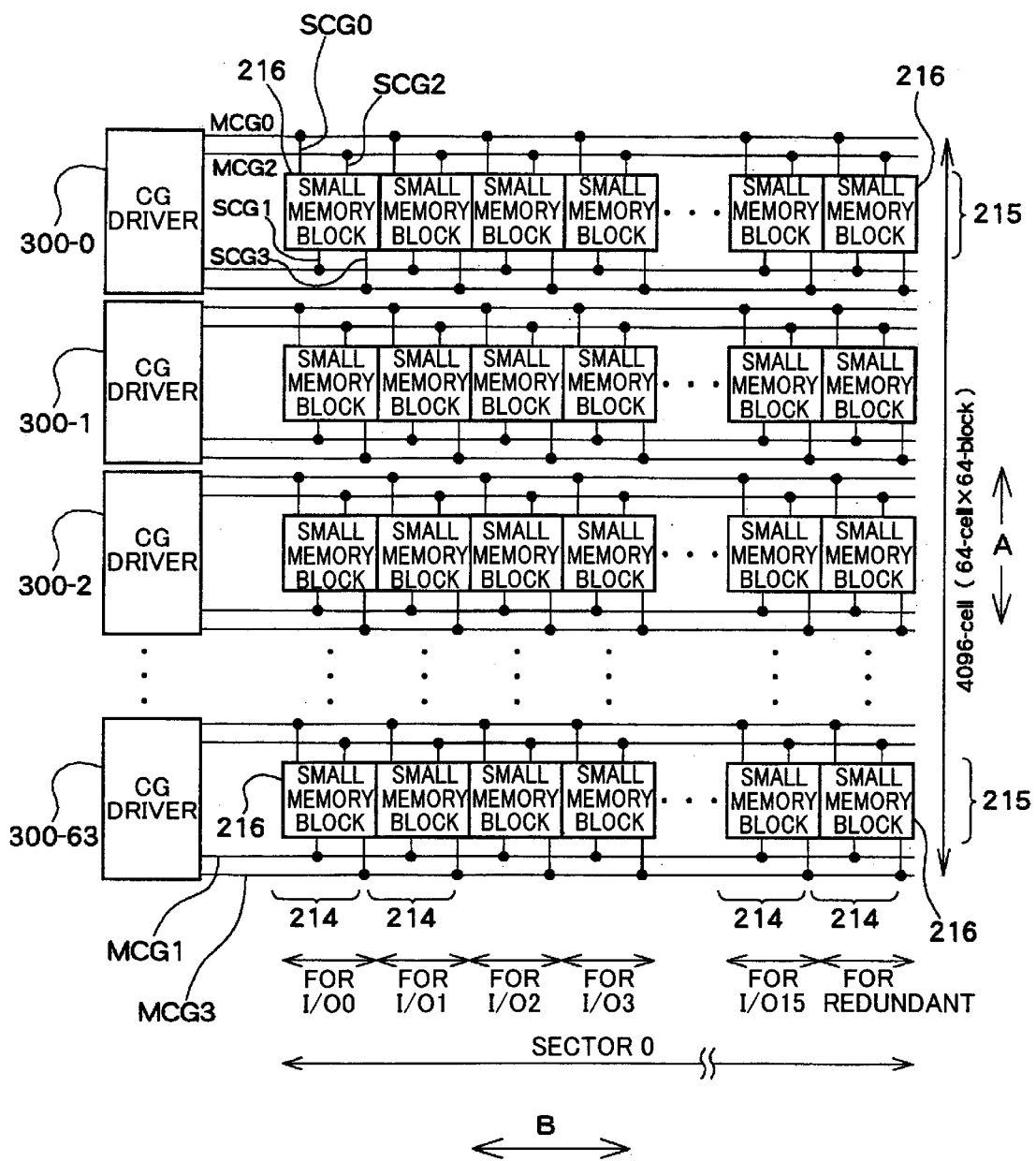
FIG. 3 is a schematic view for describing a plurality of small memory blocks and wiring thereof in one sector region shown in FIG. 2B.
Figure 4:
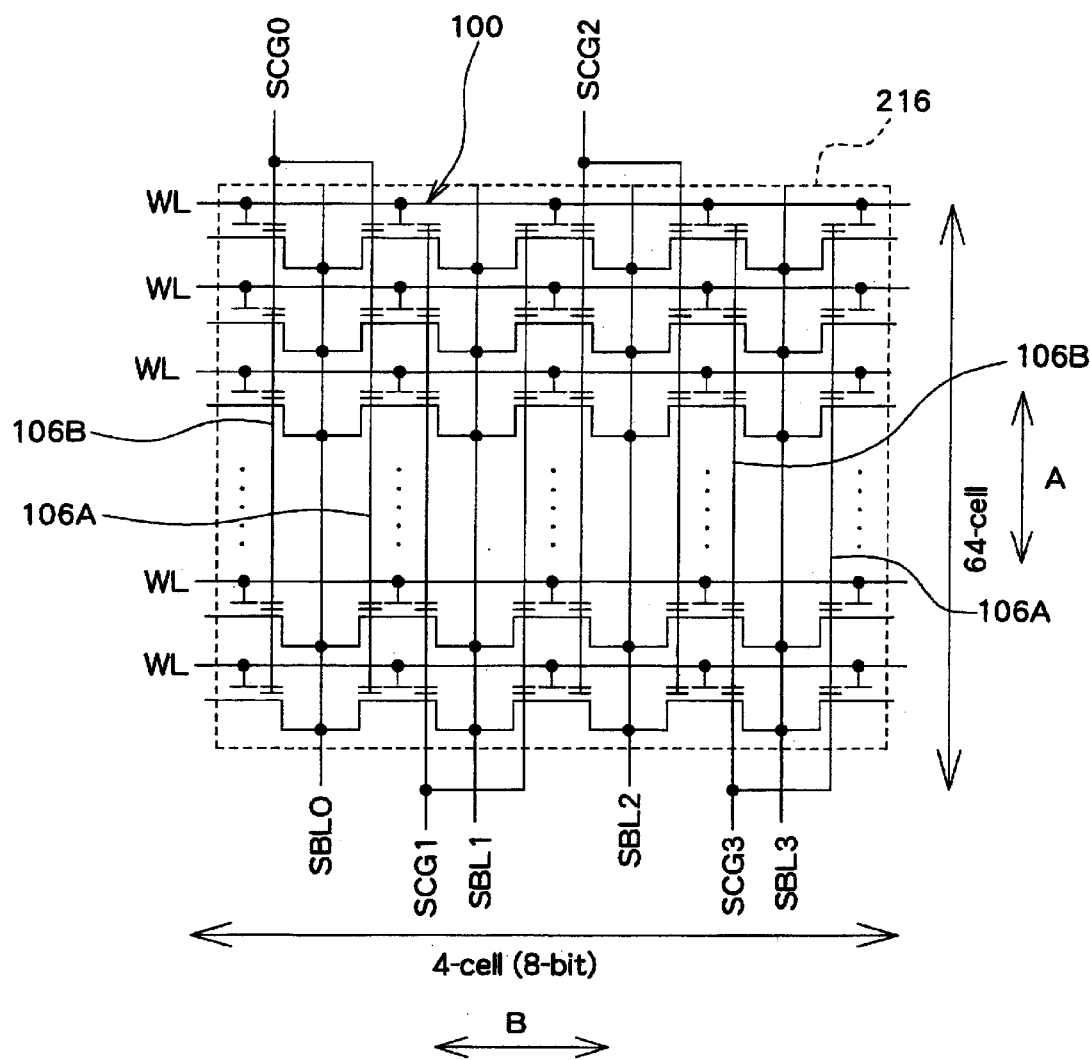
FIG. 4 is a circuit diagram of the small memory block shown in FIG. 3.

FIG. 3 shows a detail of the sector 0 shown in FIG. 2A. The small memory block 216 shown in FIG. 3 is a division of one small block 215 into seventeen (example of n=17) in a transverse direction, as shown in FIG. 2E. The small memory block 216 shown in FIG. 3 is arranged with memory cells 100 in the number, for example, of 64 in a column direction by, for example, 4 in the row direction, as shown in FIG. 4. One small memory block 216 is connected, for example, with four sub-control gate lines SCG0 to SCG3, four sub-bit lines SBL0 to SBL3 as data input/output lines and sixty-four word lines WL.

Herein, the even-numbered sub-control gate lines SCG0 and SCG2 are commonly connected with the second control gates 106B of a plurality of memory cells on the even-numbered column (0th or 2nd column) and the first control gates 106A of a plurality of memory cells on the odd-numbered column (1st or 3rd column). Similarly, the odd-numbered sub-control gate lines SCG1 and SCG3 are commonly connected with the second control gates 106B of a plurality of memory cells on the odd-numbered column (1st or 3rd column) and the first control gates 106A of a plurality of memory cells on the even-numbered column (2nd or 4th column).

As shown in FIG. 3, one first memory block 214 (regular memory block and redundant memory block) has therein sixty-four small memory blocks 216 arranged in the column direction. Furthermore, one first memory block 214 has, in the row direction, sixteen small memory blocks 216 arranged correspondingly to the sixteen I/O of I/O0 to I/O15 and one redundant small memory blocks 216 (see also FIG. 2E). These small memory blocks in the unit of row constitute each small block 215.

The seventeen sub-control gate lines SCG0, of seventeen small memory blocks 216 arranged in the row direction, are commonly connected to a main control gate line MCG0 extending in the row direction. Similarly, seventeen sub-control gate lines SCG1 are commonly connected to a main control gate line MCG1, seventeen sub-control gate lines SCG2 are commonly to a main control gate line MCG2, and seventeen sub-control gate lines SCG3 are commonly to a main control gate line MCG3.

Each small block 215 within the sector region 0 is provided with one of local control gate drivers (CG drivers)

300-0 to 300-63 as a control gate drive section. The CG driver 300-0 to 300-63 is connected with the four main control gate lines MCG0 to MCG3 extending in the row direction.

Figure 5:
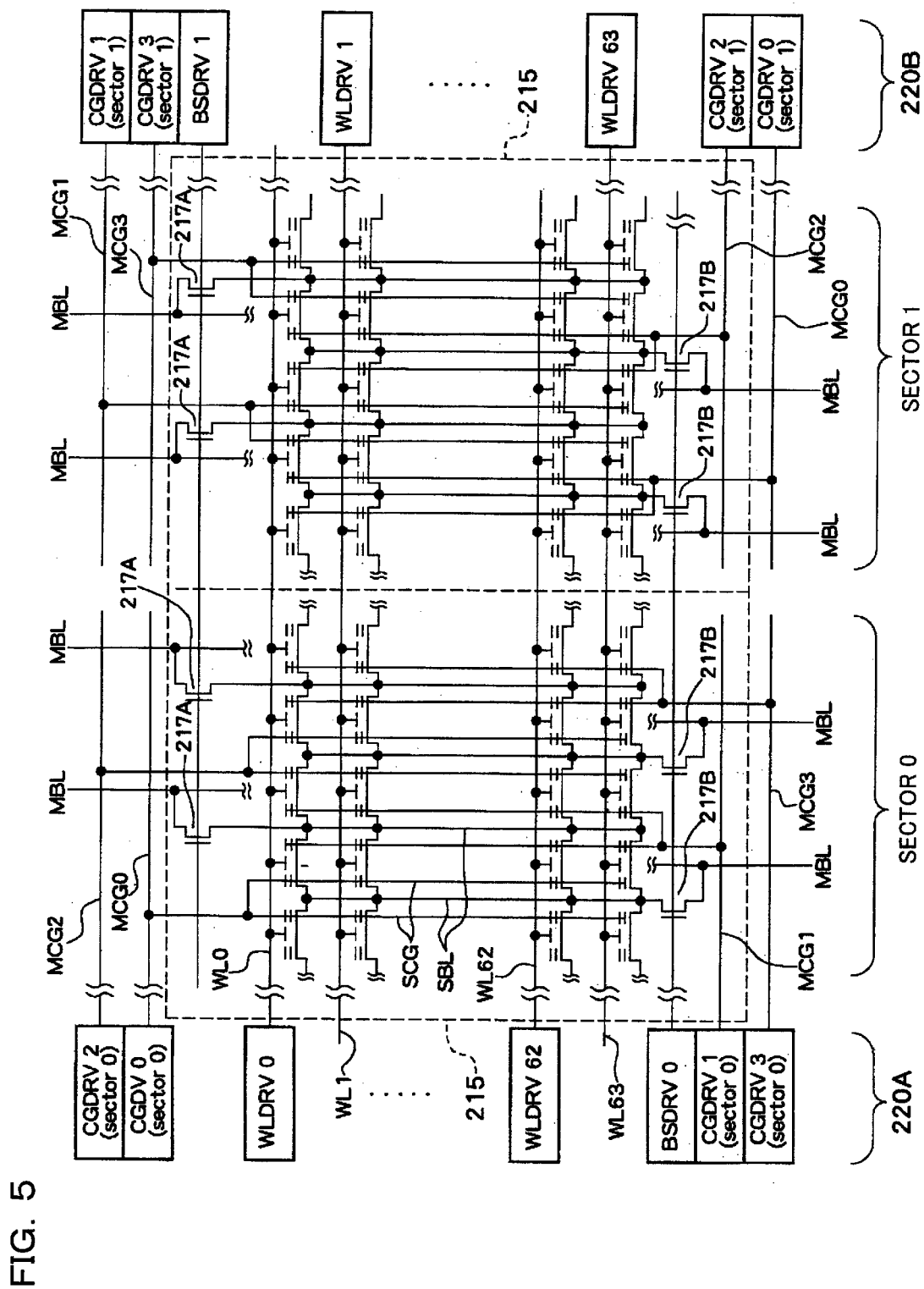
FIG. 5 shows a relationship between the small block shown in FIG. 3 and a local driver region.

FIG. 5 shows a relationship between the two small blocks belonging to the adjacent sector region 0 and sector region 1. Although the sector region 0 and the sector region 1 share sixty-four word lines WL0 to WL63, the main control gate lines MCG0 to MCG3 and the main bit lines MBL are independently provided respectively. Particularly, there are shown in FIG. 5 the local control gate drivers CGDRV0 to 3 (one of CG drivers 300-0 to 300-63 shown in FIG. 3) corresponding to the small block 215 within the sector region 0 and the local control gate drivers CGDRV0 to 3 corresponding to the small block 215 within the sector 1. In this manner, the local control gate drivers are provided independent of each small block 215.

The sub-bit lines SBL0 (impurity layers) arranged in each small block 215 are commonly connected to the main bit line MBL as a metal line. The main bit lines MBL are shared by the small memory blocks 216 arranged in the column direction A. Bit-line select gates 217A and 217B, as bit-line select switches, are arranged on the respective routes from the main bit lines MBL to the sub-bit lines SBL0 within the small memory blocks. The bit-line select gate 217A is connected to the odd-numbered sub-bit line SBL whereas the bit-line select gate 217B is connected to the even-numbered sub-bit line SBL.

Herein, the small block 215 shown in FIG. 2D is to be defined as in the below. The memory cells 100, connected in the column direction within one small block 215, share the sub-control gate line SCG (see FIG. 5). The memory cells 100, connected in the column direction within one small block 215, share the sub-bit line SBL (see FIG. 5). Also, the adjacent two small blocks 215 with respect to the column direction are demarcated by an area forming the bit-line select gate 217A and 217B. Furthermore, the memory cells 100 connected with respect to the row direction of one small block 215 is allowed to erase data simultaneously by being belonged to any one of the sectors.

Figure 6:
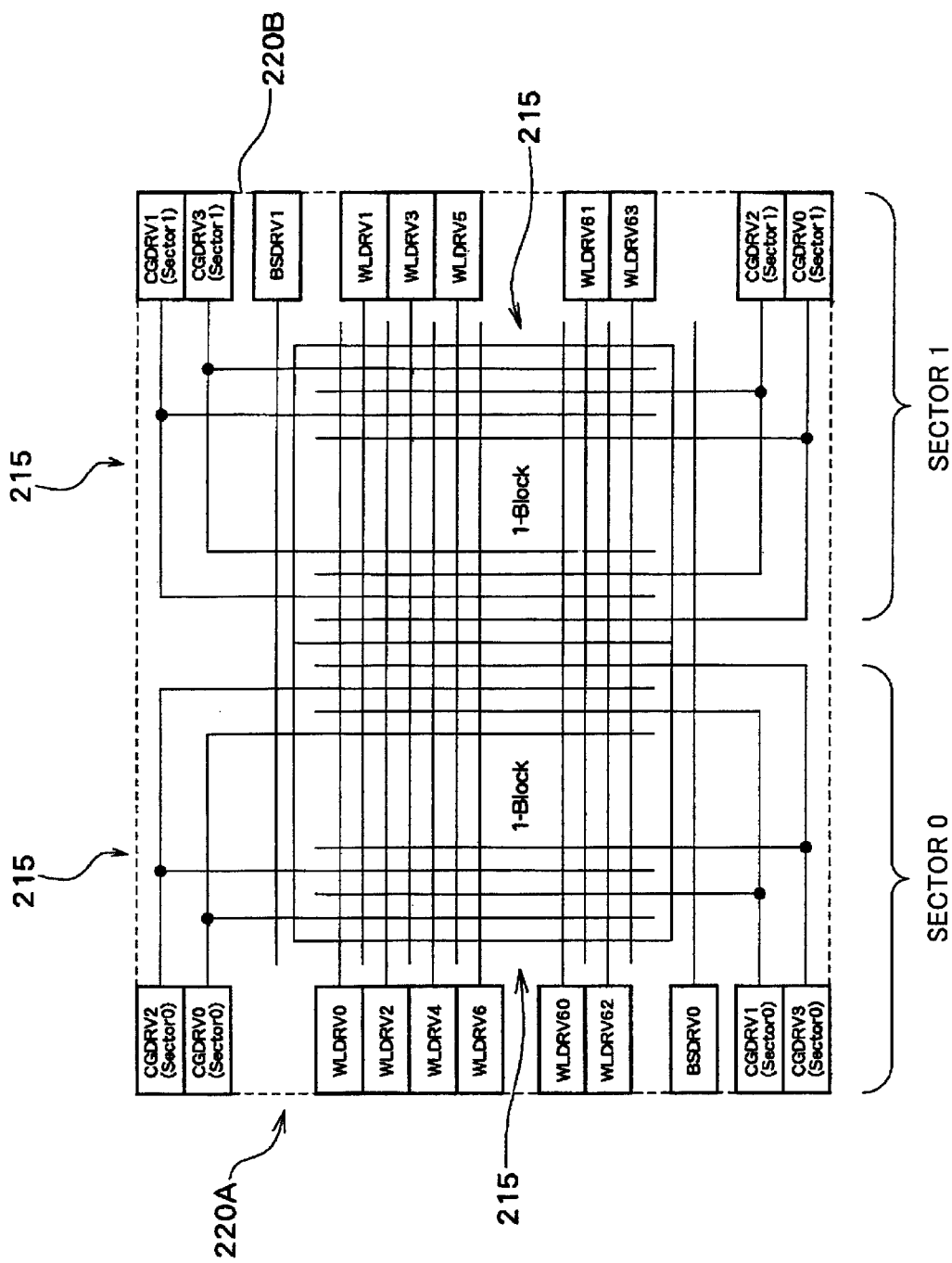
FIG. 6 is a schematic diagram describing a relationship between the two small blocks in adjacent two sectors and the local driver region.

FIG. 6 shows a detail of the two small blocks 215 and the local driver regions 220A and 220B on the both sides therewithin the adjacent two, 0th and 1st sector regions 210. As shown in FIG. 6, the local driver region 220A, in the left, is arranged with the local control gate-line drivers CGDRV0 to CGDRV3 shown in FIG. 5. Similarly, the local driver region 220B, in the right, is arranged with the local control gate-line drivers CGDRV0 to CGDRV3 shown in FIG. 5.

Also, the local driver region 220A, in the left, is arranged with local word-line drivers WLDRV0, . . . WLDRV62 to drive even-numbered word lines WL0, 2, . . . and 62 within the sectors 0 and 1. The local driver region 220B, in the right, is arranged with local word-line drivers WLDRV1 . . . . WLDRV63 to drive odd-numbered word lines WL1, 3, . . . and 63 within the sectors 0 and 1.

Furthermore, as shown in FIGS. 5 and 6, the local driver region 220B, in the right, is arranged with a local bit-line driver BSRV1 to drive the bit-line select gate 217A connected to the odd-numbered sub-bit line SBL of the sectors 0 and 1. The local driver region 220A, in the left, is arranged with a local bit-line driver BSRV0 to drive the bit-line select gate 217B connected to the even-numbered sub-bit line SBL of the sectors 0 and 1.

Drive Circuit of Sectors 0 and 1

Figure 7:
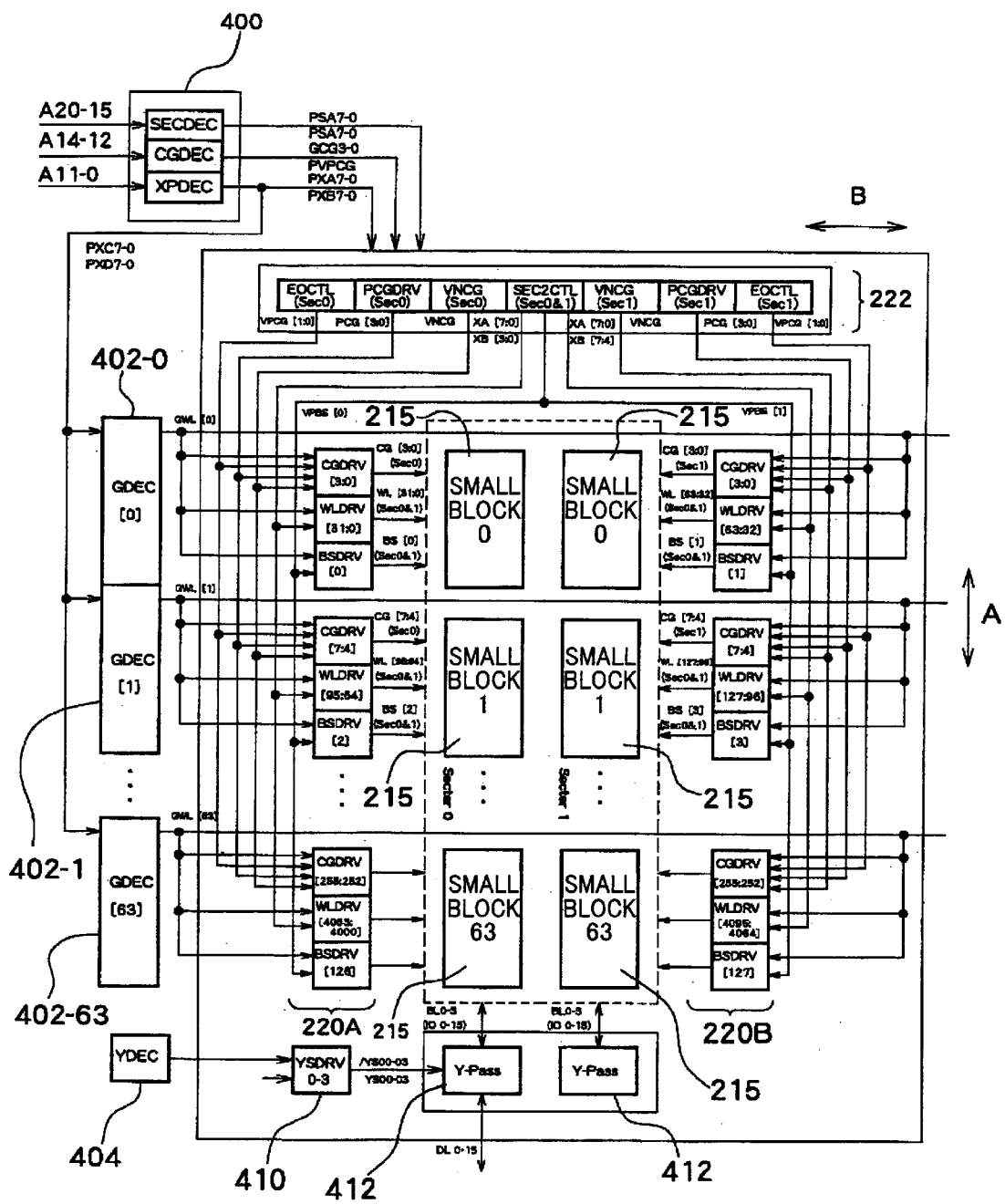
FIG. 7 is a block diagram showing a peripheral drive circuit of the adjacent two sectors.

Explanation is now made on a circuit for driving the memory cell within the small block 215 within the sectors 0 and 1, with reference to FIG. 7.

The configuration, shared by the sectors 0 to 63, includes a predecoder 400, sixty-four global decoders 402-0 to 402-63 and a Y-decoder 404.

The predecoder 400 is to decode an address signal A [20-0] specifying a nonvolatile memory cell (selection cell) to be selected. The address signal A[20-0] has a significance shown in the below Table 1.

TABLE 1

| Address | Group | Function | |
|---|---|---|---|
| A[20–15] | Sector | Choose 1 of 64 | |
| A[14–12] | column | Choose 1 of 8 | |
| A[11–9] | Large block | Choose 1 of 8 | Choose 1 of 4096 |
| A[8–6] | Small block | Choose 1 of 8 | |
| A[5–0] | Row | Choose 1 of 64 | |

As shown in Table 1, a high-level address signal A[20-15] is to select one sector out of the sixty-four sectors. A middle-level address signal A[14-12] is to select one bit out of four cells (8 bits) within one small memory block 216 shown in FIG. 4. A low-level address signal A [11-0] is to select one word line out of those 4096 word lines within one sector. Meanwhile, an address signal A [11-9] selects one among the eight large blocks 212 existing within one sector. An address signal A[8-6] selects one among the eight small blocks 215 existing within one large block 212. An address signal A [5-0] selects one among the sixty-four word lines WL existing within one small block 215.

The sixty-four global decoders 402-0 to 402-63 makes active the sixty-four global word lines GWL[0] to GWL[63] depending upon a result of predecoding the lower-level address signal A [11-0] with the predecoder 400. Note that, during data reading and upon data program, one global word line GWL only is made active (Vdd). When one sector is erased in batch during data erasure, all the sixty-four global word lines GWL are made active (Vdd). Due to this, all the word lines WL in one sector are selected to supply a word-line voltage for erasure.

The Y-decoder 404 drives a Y-path circuit 412 through a Y-path select driver 410, to thereby connect a selected bit line of the small block 215 to a rear-staged sense amplifier 520 (see FIG. 8) or a bit-line driver.

Reference Cell Array

Figure 8:
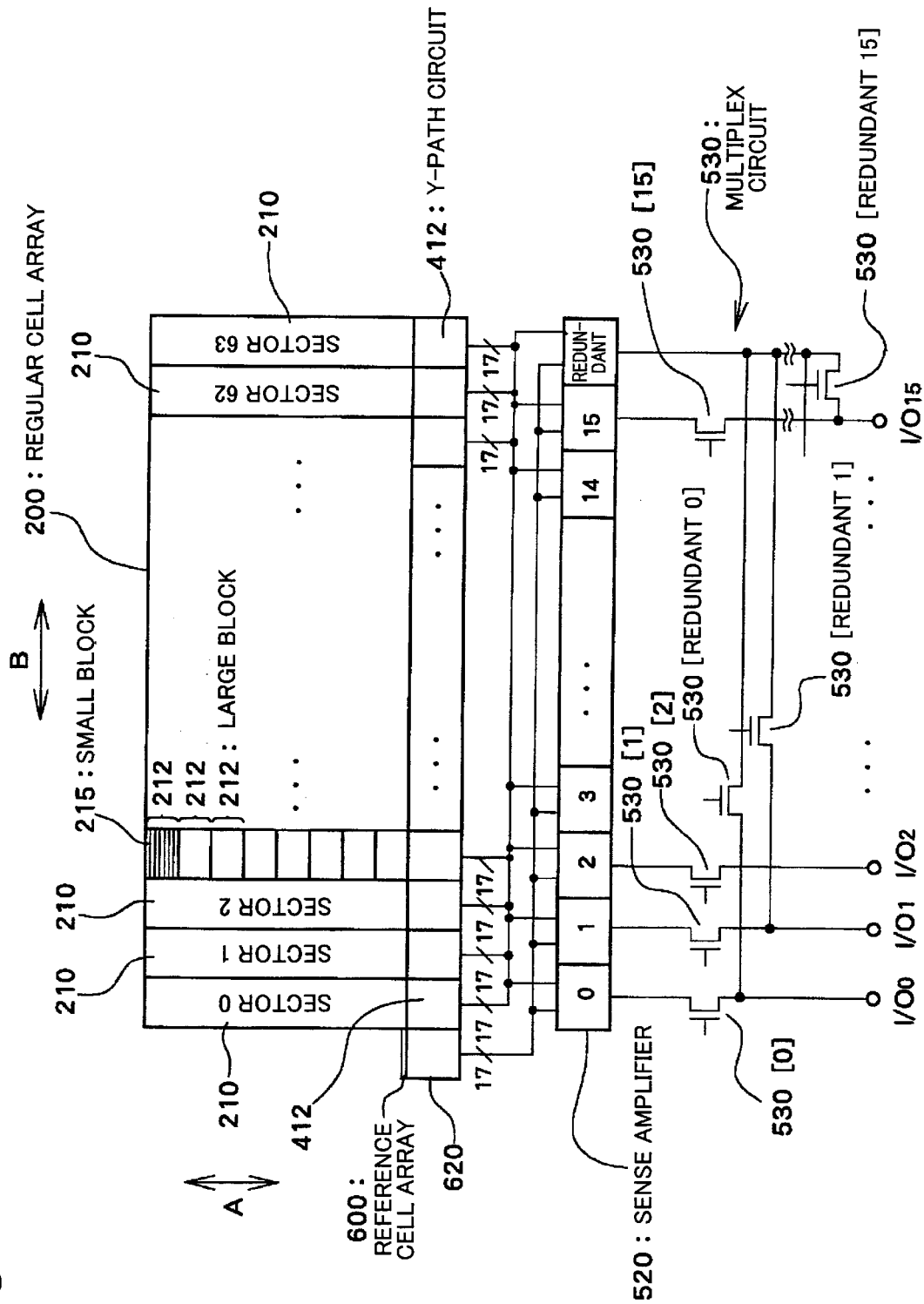
FIG. 8 is a schematic diagram describing an entire memory showing a regular cell array, a reference cell array, a Y-path circuit, a sense amplifier, a multiplex circuit and an input/output terminal.

FIG. 8 shows an overall configuration of a memory including a reference cell array 600 separately formed from the regular cell array 200 shown in FIGS. 2A to 2E.

Figure 9:
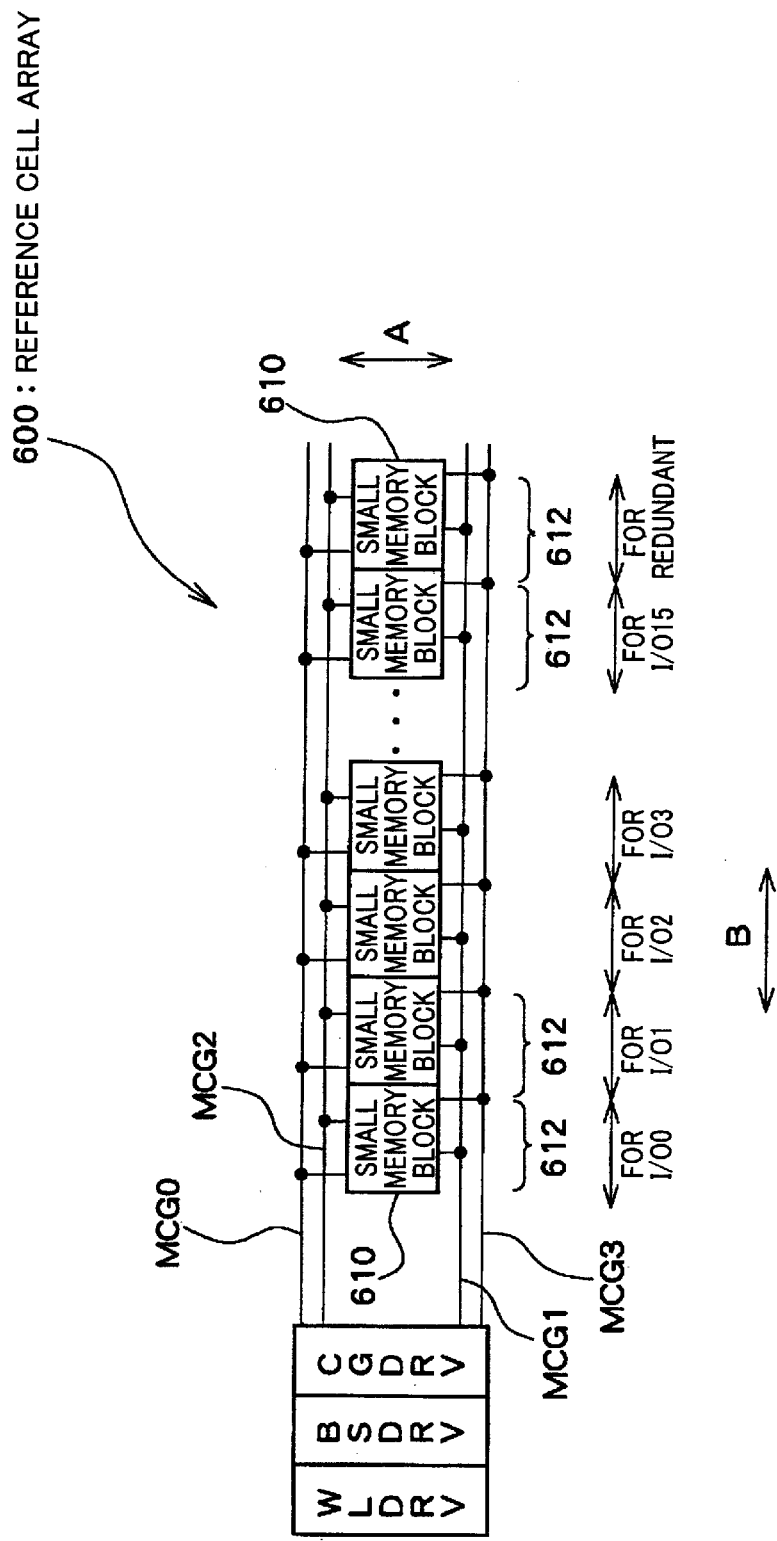
FIG. 9 is a schematic diagram describing the reference cell array shown in FIG. 8.

The reference cell array 600 shown in FIG. 8 has the same configuration as the one small block 215 of the regular cell array 200, the outline of which is as per the showing in FIG. 9. As shown in FIG. 9, the reference cell array has seventeen small memory blocks 610 provided along the row direction B.

In the regular cell array 200, the first memory block 214, divided into seventeen in the row direction B, had sixty-four small memory blocks 216 in the column direction A, as shown in FIG. 3. The reference cell array 600 also has a second memory block 612 divided into sixteen in the row direction B, as shown in FIG. 9. However, the second memory block 612 has only one small memory block 610 in the column direction A.

Note that this reference cell array 600 is the same as the regular cell array 200 in that it has a local control gate driver CGDRV, a local bit-line driver BSDRV and a local word-line driver WLDRV.

The cell count and arrangement in the small memory block 610 is the same as that of the small memory block 216 shown in FIG. 3. In other words, the small memory block 610 is also arranged with sixty-four memory cells 100 in the column direction A and four memory cells 100 in the row direction B, as shown in FIG. 4. As a result, the cell count and arrangement in the reference memory cell 600 is the same as that of the small block 215, i.e. sixty-four memory cells 100 are arranged in the column direction A while sixty-four memory cells 100 are arranged in the row direction B.

The reason why the reference cell array 600 has the same configuration as the small block 215 in this manner is because of the following. The minimum unit of memory cell 100 group in the regular cell array 200 is based on the small block 215. This is because, in the small block 215, the sub-control gate line SCG is shared and the sub-bit line SBL is shared. Moreover, the adjacent two small blocks 215 with respect to the column direction A are demarcated in plan by the bit-line select gate 217A and 217B. Also, in operation, because data erasure is based on each sector 210, the range of data erasure in the row direction B is based on the small block 215.

Herein, the cell 100 within the reference cell array 600 has a cell current to serve as a reference of upon detecting a cell current through the cell 100 within the regular cell array 200. Although it is ideal that the characteristics of the both cell currents (temperature characteristic, voltage characteristic, etc.) coincide with each other, the cell current characteristics possibly change depending on a cell position. In order to make equal the tendency of cell positional variation, the reference cell array 610 adopts the same configuration as the small block 215 that is the minimum arrangement unit of cells 100 within the regular cell array 200.

Every memory cell 100 within the reference cell array 600 has in an erasure state upon shipment.

Description of Y-path Circuit and Sense Amplifier

As shown in FIG. 8, the sixty-four sectors 210 of the regular cell array 200 are respectively connected with Y-path circuits 412 (see also FIG. 7). Similarly, the reference cell array 600 is also connected with a Y-path circuit 620.

ing $2^N$ (N: integer of 2 or greater), it is possible to specify a memory cell 100 depending on a decode output.

Figure 10:
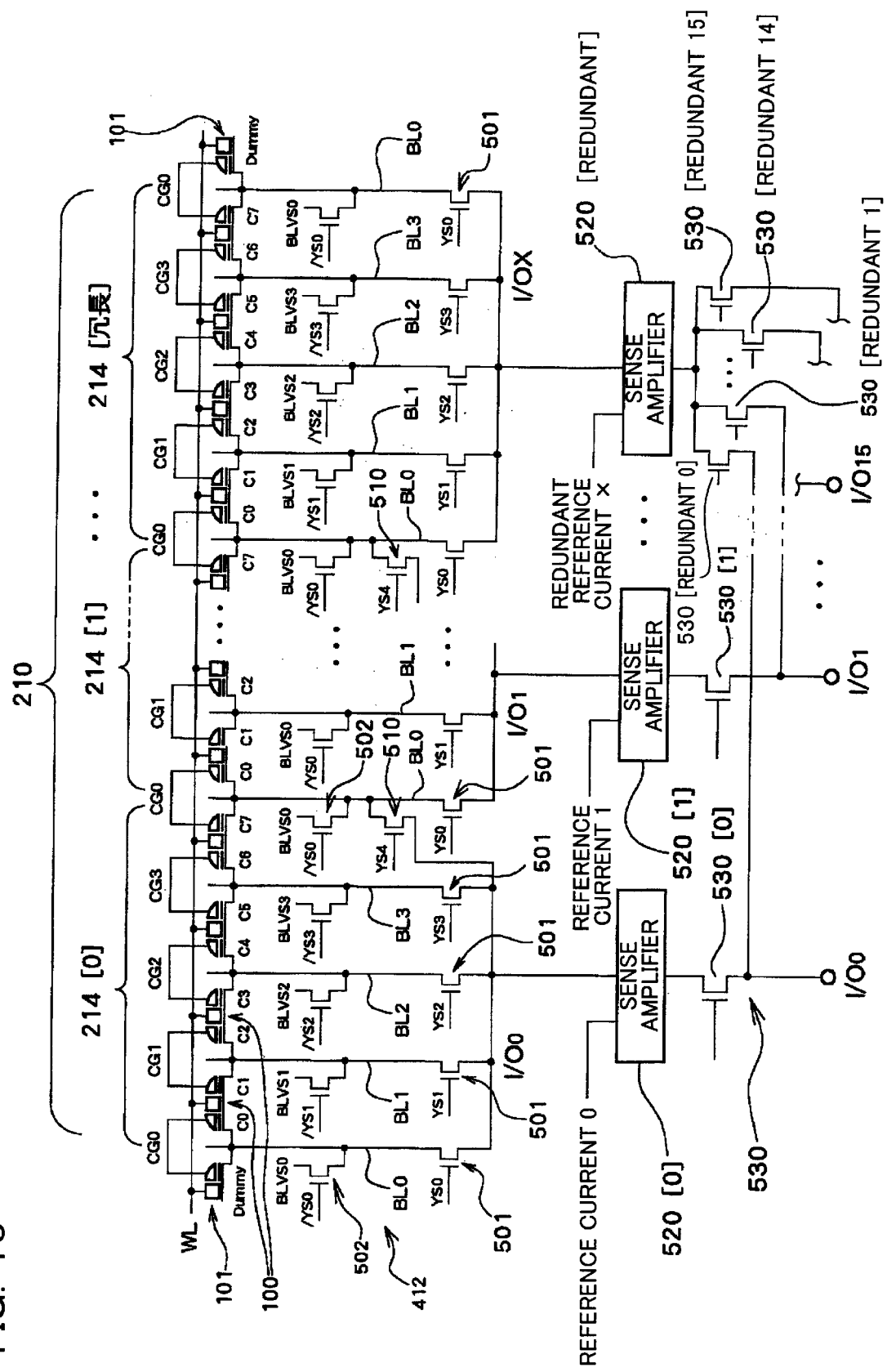
FIG. 10 is a circuit diagram showing an example of the Y-path circuit connected to the regular cell array shown in FIG. 8.

Herein, the totally eight cells (nonvolatile memory cells) provided in the four memory cells 100 connected in the row direction within the first memory block 214, are defined as cells C0 to C7 as shown in FIG. 10.

Meanwhile, one sector region 214 is connected, at its both ends in the row direction, with dummy cells 101 each having one of the first and second control gates 108A and 108B and word gate.

The main bit lines BL0 to BL3 provided to one first memory block 214 are each connected with a first select gate 501. The gates of the four first select gates (transistors) 501 provided corresponding to one first memory block 214 are applied by any of voltages YS0 to YS3. The four first select gates 501, at the other ends, are commonly connected to the I/O line. As shown in FIG. 8, the I/O0 to I/O15 and I/Ox are provided corresponding to the seventeen first memory blocks 214[0] to 214[15] and 214[redundant].

The bit lines BL0 to BL3 are respectively connected with transistors 502 for designating the gate voltage as any of /YS0 to /YS3. In case this transistor 502 turns on, the voltage BLVS connected to a source of that transistor 502 is supplied onto the bit line BL. This voltage BLVS is set at Vdd or 0V depending upon an operation mode (see Tables 2 and 3 to be hereinafter referred).

The second select gate 510 provided in the Y-path circuit 412 shown in FIG. 8 is to connect/disconnect, for example, the bit line BL0 positioned at the boundary between the block 214[0] and the block 214[1] to an I/O output line (I/O0). The second select gate 510 is provided to the bit line BL0 connected to/from the dummy cell 101 at the right end in FIG. 10. This second select gate 510 is supplied by a gate voltage YS4.

Herein, Table 2 shows voltages at various points during data reading wherein any of the eight cells C0 to C7 of the first memory block 214 is selected as a selected cell.

TABLE 2

READ (REGULAR CELL ARRAY)

| Address | | | Selected Cell | Control Gate | | | | Y-Select Gate | | | | | Y-Deselect Gate | | | | BLVSS | | | |
| --- | --- | --- | --- | --- | --- | --- | --- | --- | --- | --- | --- | --- | --- | --- | --- | --- | --- | --- | --- | --- |
| A14 | A13 | A12 | | CG0 | CG1 | CG2 | CG3 | YS0 | YS1 | YS2 | YS3 | YS4 | /YS0 | /YS1 | /YS2 | /YS3 | BL-VS0 | BL-VS1 | BL-VS2 | BL-VS3 |
| 0 | 0 | 0 | C0 | 1.5 V | 3.0 V | 0 V | 0 V | 0 V | Vdd | 0 V | 0 V | 0 V | Vdd | 0 V | Vdd | Vdd | 0 V | 0 V | Vdd | 0 V |
| 0 | 0 | 1 | C1 | 3.0 V | 1.5 V | 0 V | 0 V | Vdd | 0 V | 0 V | 0 V | 0 V | 0 V | Vdd | Vdd | Vdd | 0 V | 0 V | 0 V | Vdd |
| 0 | 1 | 0 | C2 | 0 V | 1.5 V | 3.0 V | 0 V | 0 V | 0 V | Vdd | 0 V | 0 V | Vdd | Vdd | 0 V | Vdd | 0 V | 0 V | 0 V | Vdd |
| 0 | 1 | 1 | C3 | 0 V | 3.0 V | 1.5 V | 0 V | 0 V | Vdd | 0 V | 0 V | 0 V | Vdd | 0 V | Vdd | Vdd | Vdd | 0 V | 0 V | 0 V |
| 1 | 0 | 0 | C4 | 0 V | 0 V | 1.5 V | 3.0 V | 0 V | 0 V | 0 V | Vdd | 0 V | Vdd | Vdd | Vdd | 0 V | Vdd | 0 V | 0 V | 0 V |
| 1 | 0 | 1 | C5 | 0 V | 0 V | 3.0 V | 1.5 V | 0 V | 0 V | Vdd | 0 V | 0 V | Vdd | Vdd | 0 V | Vdd | 0 V | Vdd | 0 V | 0 V |
| 1 | 1 | 0 | C6 | 3.0 V | 0 V | 0 V | 1.5 V | 0 V | 0 V | 0 V | 0 V | Vdd | 0 V | Vdd | Vdd | Vdd | 0 V | Vdd | 0 V | 0 V |
| 1 | 1 | 1 | C7 | 1.5 V | 0 V | 0 V | 3.0V | 0 V | 0 V | 0 V | Vdd | 0 V | Vdd | Vdd | Vdd | 0 V | 0 V | 0 V | Vdd | 0 V |

FIG. 10 shows the Y-path circuit 412 shown in FIGS. 7 and 8. The Y-path circuit 412 is provided one for one sector 210, i.e. totally sixty-four (example of M=64). In one sector 210, a first memory block 214 is arranged that is divided into seventeen as I/O0 to I/O15 and redundant one (see also FIG. 2B).

Each first memory block 214 is connected with four memory cells 100 in the row direction. Four is the minimum number as the number of connections in the row direction of memory cells 100 within one memory block 214. If provid- In the case that the respective cells C2 of the first memory blocks 214[0] to 214[15] shown in FIG. 10 for example are selected, the selected cell C2 at its control gate CG1 is applied by a selection voltage (1.5 V), the unselected opposite cell C3 at its control gate CG2 is by an override voltage (3.0 V) and the other unselected cell at its control gates CG0 and CG3 is by an unselected voltage (0 V) as shown in Table 2. As a result, the cell current from each selected cell C2 of the first memory blocks 214[0] to 214[15] flows to the sense amplifier 520[0] to 520[15] through the bit line BL2 and the select gate 501 having a gate signal YS2 designated to the voltage Vdd.

In the case a defective cell exists in any one of the first memory blocks 214[0] to 214[15], the redundant memory block 214[redundant] is selected in place of the first memory block 214 including the defective cell. Thus, a cell current from the cell C2 of the redundant memory block 214 [redundant] flows to the sense amplifier 520[redundant].

The seventeen (example of n=17) sense amplifiers 520[1] to 520[15] and 520[redundant] are shared by the sixty-four sectors 210[0] to 210[63], as shown in FIG. 8.

The sense amplifiers 520[1] to 520[15] and 520 [redundant] are also supplied by a reference potential from the Y-path circuit 620 connected to the reference cell array 600.

Figure 11:
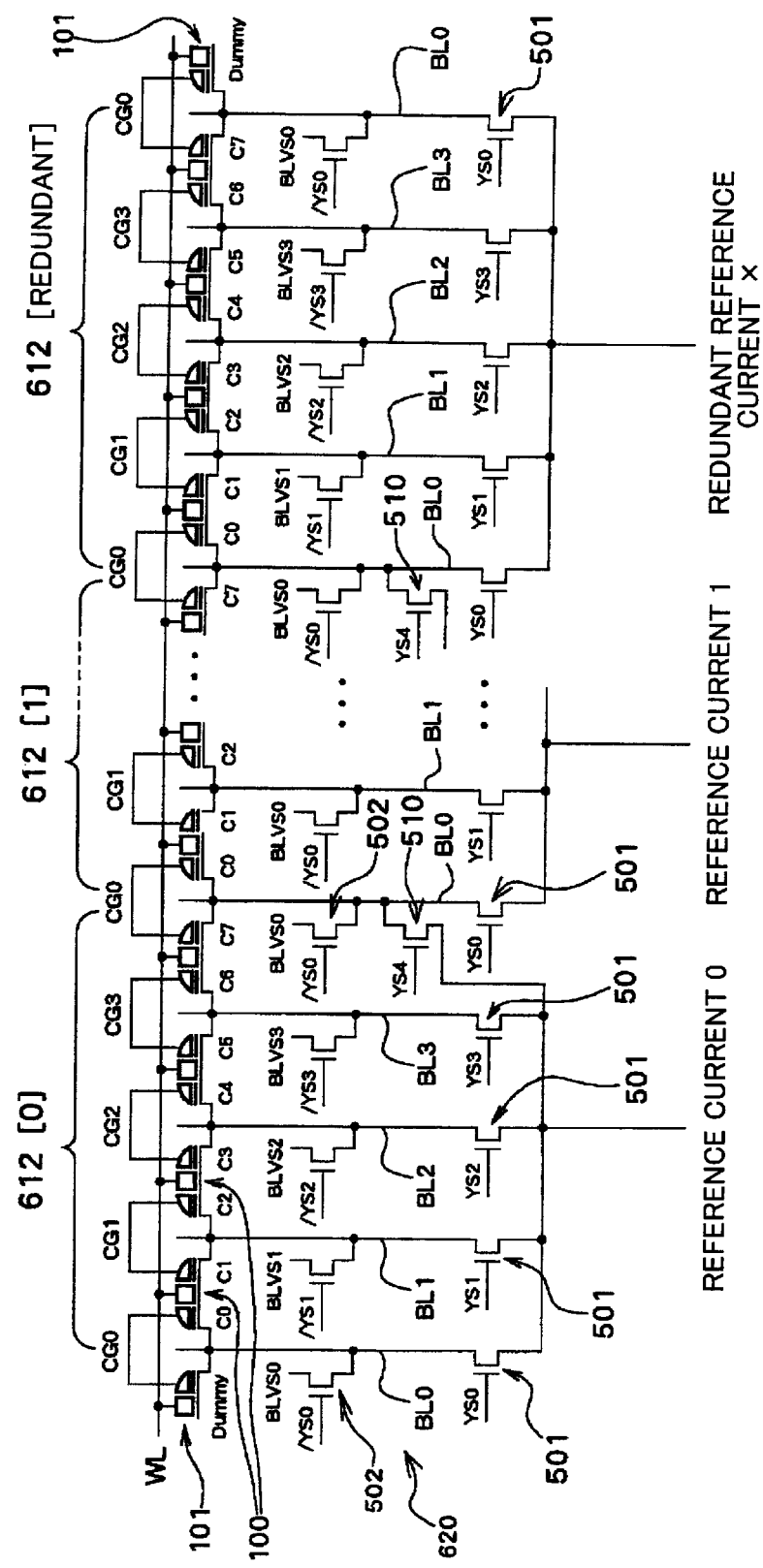
FIG. 11 is a circuit diagram showing an example of the Y-path circuit connected to the reference cell array shown in FIG. 8.

The Y-path circuit 620, shown in FIG. 11, has the same configuration as the Y-path circuit 412 shown in FIG. 10. The identical references with the members shown in FIG. 10 are attached to the members shown in FIG. 11.

Table 3 shows voltages at various points during reference data reading wherein any of eight cells C0 to C7 of the second memory block 612 is selected as a selected cell.

In this manner, the same address as that in the small block 215 of regular cell array 200 is designated in the reference cell array 600. Due to this, it is possible to reduce the variation of cell current depending on the cell position.

Also, as shown in FIGS. 10 and 11, there is no element, on an input side of the sense amplifier 520, for switching from a defective memory block to the redundant memory block. In case such an element be added, impedance increases on a current input route to the sense amplifier 520, thus giving rise to a necessity to change the access time.

As shown in FIG. 10, a multiplex circuit 530 is provided on an output side of the sense amplifiers 520[0] to 520[15] and 520[redundant]. In this multiplex circuit 530, select gates 530[0] to 530[15] are respectively provided between the output ends of sense amplifiers 520[0] to 520[15] and the sixteen (example of n−1=16) input/output terminals I/O0 to I/O15. Also, select gates 530[redundant 0] to 530[redundant 15] are respectively connected between the output ends of sense amplifiers 520[redundant] and the input/output terminals I/O0 to I/O15.

If there is no defect in the first memory blocks 214[0] to 214[15], the select gates 530[0] to 530[15] turn on during data reading. The data from each block 214[0] to 214[15] is

TABLE 3

READ (REFERENCE CELL ARRAY)

| Address | | | Selected Cell | Control Gate | | | | Y-Select Gate | | | | | Y-Deselect Gate | | | | BLVSS | | | |
|---|---|---|---|---|---|---|---|---|---|---|---|---|---|---|---|---|---|---|---|---|
| A14 | A13 | A12 | Cell | CG0 | CG1 | CG2 | CG3 | YS0 | YS1 | YS2 | YS3 | YS4 | /YS0 | /YS1 | /YS2 | /YS3 | BL-VS0 | BL-VS1 | BL-VS2 | BL-VS3 |
| 0 | 0 | 0 | C0 | 1.5 V | 1.5 V | 0 V | 0 V | 0 V | Vdd | 0 V | 0 V | 0 V | Vdd | 0 V | Vdd | Vdd | 0 V | 0 V | Vdd | 0 V |
| 0 | 0 | 1 | C1 | 1.5 V | 1.5 V | 0 V | 0 V | Vdd | 0 V | 0 V | 0 V | 0 V | 0 V | Vdd | Vdd | Vdd | 0 V | 0 V | 0 V | Vdd |
| 0 | 1 | 0 | C2 | 0 V | 1.5 V | 1.5 V | 0 V | 0 V | 0 V | Vdd | 0 V | 0 V | Vdd | Vdd | 0 V | Vdd | 0 V | 0 V | 0 V | Vdd |
| 0 | 1 | 1 | C3 | 0 V | 1.5 V | 1.5 V | 0 V | 0 V | Vdd | 0 V | 0 V | 0 V | Vdd | 0 V | Vdd | Vdd | Vdd | 0 V | 0 V | 0 V |
| 1 | 0 | 0 | C4 | 0 V | 0 V | 1.5 V | 1.5 V | 0 V | 0 V | 0 V | Vdd | 0 V | Vdd | Vdd | Vdd | 0 V | Vdd | 0 V | 0 V | 0 V |
| 1 | 0 | 1 | C5 | 0 V | 0 V | 1.5 V | 1.5 V | 0 V | 0 V | Vdd | 0 V | 0 V | Vdd | Vdd | 0 V | Vdd | 0 V | Vdd | 0 V | 0 V |
| 1 | 1 | 0 | C6 | 1.5 V | 0 V | 0 V | 1.5 V | 0 V | 0 V | 0 V | 0 V | Vdd | 0 V | Vdd | Vdd | Vdd | 0 V | Vdd | 0 V | 0 V |
| 1 | 1 | 1 | C7 | 1.5 V | 0 V | 0 V | 1.5 V | 0 V | 0 V | 0 V | Vdd | 0 V | Vdd | Vdd | Vdd | 0 V | 0 V | 0 V | Vdd | 0 V |

Herein, in Table 3, the difference from Table 2 lies in that the selected cell and the unselected opposite cell were both given, for their control gate voltages, 1.5 V that is the same as the select voltage. Specifically, the unselected opposite cell is not applied by 3 V but 1.5 V as an override voltage. This is because all the cells in the reference memory cell array 600 have been programmed in an erasure state during shipment. The override voltage is a voltage required, regardless of the presence or absence of a program for the unselected opposite cell, to turn on the opposite cell transistor and flow a read or program current. Consequently, because the cell is programmed in an erasure state, a reference cell current can be read out even by applying 1.5 V, same as the select voltage, to the control gate of the unselected opposite cell.

Differently from Table 3, an override voltage (3V) may be naturally applied to the unselected opposite cell during reference-data reading.

Herein, when reading 16-bit (example of n−1=16) data out of the regular cell array 200, sixteen selected cells are designated by an address signal [20:0] shown in Table 1. On the other hand, when reading a 16-bit reference potential out of the reference cell array 600 simultaneously therewith, it is satisfactory to use only a lower-level address A[14:12] of the column address A [20:12] and lower-level address A [5:0] of the row address A[11:0]. This is because that a row address (one of C0 to C7) of the reference cell array 600 can be designated by the address A[14:12] and a column address (one of sixty-four word lines) can be by the address A[5:0].

outputted onto the input/output terminal I/O0 to I/O15. At this time, the select gates 530[redundant 0] to 530[redundant 15] are all off. should the first memory block 214[0] is defective, the select gate 530[0] is turned off while the select gate 530[redundant 0] is turned on. Thus, data reading is made from the redundant memory block 214 [redundant] in place of the first memory block 214[0].

The present invention is not limited to the above embodiment but can be modified in various ways within the scope of the gist of the invention.

The present invention is characterized in setting the reference cell array. Although the detailed explanation was omitted for the voltage setting onto the word line, bit line and control gate line, and the operations of reading, programming and erasing the nonvolatile memory cell, these are detailed, e.g. in U.S. Ser. No. 09/955,160 by the present applicant.

What is claimed is:

1. A nonvolatile semiconductor memory device comprising:

a regular cell array in which a plurality of memory cells are arranged in row and column directions, each of the memory cells having one word gate and first and second nonvolatile memory cells controlled by first and second control gates, respectively; and a reference cell array in which a plurality of reference memory cells are arranged in the row and column directions, each of the reference memory cells having the same structure as each of the memory cells, wherein the regular cell array has M numbers of large blocks formed by dividing the regular cell array in the column direction, and each of the M numbers of large blocks has m numbers of small blocks formed by finely dividing each of the large blocks in the column direction, and wherein number and arrangement of the reference memory cells within the reference cell array are coincident with number and arrangement of the memory cells arranged in each of the m numbers of small blocks.

2. The nonvolatile semiconductor memory device as defined by claim 1, wherein each of the m numbers of small blocks has a plurality of sub-bit lines extending along the column direction, and each of the sub-bit lines is commonly connected to the first and second nonvolatile memory cells that are adjacent each other in two of the memory cells adjacent in the row direction in each row.

3. The nonvolatile semiconductor memory device as defined by claim 2, further comprising a plurality of main bit lines extending across the M numbers of large blocks along the column direction, wherein m numbers of bit-line select switches are arranged on each column, the bit line select switches selecting one of the m numbers of sub-bit lines positioned on the same column within each of the m numbers of small blocks and connecting the selected one of the sub-bit lines to one of the main bit lines, and regions of the two small blocks adjacent in the column direction are demarcated by a formation region of each of the m numbers of bit-line select switches on each column.

4. The nonvolatile semiconductor memory device as defined by claim 1, wherein each of the m numbers of small blocks has a plurality of sub-control gate lines extending along the column direction, and each of the sub-control gate lines is commonly connected to the first and second control gates that are adjacent each other in two of the memory cells adjacent in the row direction in each row.

5. The nonvolatile semiconductor memory device as defined by claim 1, wherein, during data reading, a low-level address from among row addresses and column addresses to be used for cell selection in the regular cell array, is used to execute cell selection in the reference cell array.

6. The nonvolatile semiconductor memory device as defined by claim 5, wherein, during data reading, one of the first and second nonvolatile memory cells in one of the memory cells is designated as a selected cell and the other is designated as an unselected opposite cell, wherein a select voltage is applied to one of the first and second control gates corresponding to the selected cell within the regular cell array and an override voltage is applied to the other of the first and second control gates corresponding the unselected opposite cell, and wherein the select voltage is applied to both of the selected cell and the unselected opposite cell of the reference memory cell within the reference cell array.

7. The nonvolatile semiconductor memory device as defined by claim 6, wherein the regular cell array is divided in the row direction into n numbers of first memory blocks, one of the n numbers of first memory blocks being designated as a redundant memory block, and wherein the reference cell array is divided in the row direction into n numbers of second memory blocks, one of the n numbers of second memory blocks being a reference redundant memory block.

8. The nonvolatile semiconductor memory device as defined by claim 7, further comprising:

n numbers of sense amplifiers provided correspondingly to the n numbers of first memory blocks;

a first path circuit which supplies cell current from the selected cell in each of the n numbers of first memory blocks to each of the n numbers of sense amplifiers; and a second path circuit which supplies reference cell current from the selected cell in each of the n numbers of second memory blocks to each of the n numbers of sense amplifiers.

9. The nonvolatile semiconductor memory device as defined by claim 8, further comprising:

(n−1) numbers of data output terminals; and a multiplex circuit which selects outputs of (n−1) numbers of sense-amplifiers from among the n numbers of sense amplifiers and supplies the selected output of the (n−1) numbers of sense amplifier to the (n−1) numbers of output terminals, respectively.

10. The nonvolatile semiconductor memory device as defined by claim 7, wherein each of the n numbers of first memory blocks and n numbers of second memory blocks has four bit lines extending along the column direction, and the number of the memory cells arranged in the row direction is determined as four in each of the n numbers of first memory blocks and each of the n numbers of second memory blocks.

11. The nonvolatile semiconductor memory device as defined by claim 7, wherein the regular cell array has N numbers of sector regions formed by dividing the regular cell array in the row direction, each of the N numbers of sector regions having the n numbers of first memory blocks, each of the N numbers of sector regions being connected with the first path circuit.

12. The nonvolatile semiconductor memory device as defined by claim 11, further comprising a control gate drive section which drives each of the first and second control gates of each of the memory cells within the regular cell array, wherein the control gate drive section has N numbers of local control gate drivers corresponding to the N numbers of sector regions, respectively, each of the N numbers of local control gate drivers being capable of setting potentials of the first and second control gates in a corresponding one of the sector regions independently of the other sector regions.

13. The nonvolatile semiconductor memory device as defined by claim 12, wherein, during data erasure, one of the N numbers of control gate drivers is selected to supply an erasing high potential to the first and second control gates in one sector region selected from the N numbers of sector regions so that data is erased for each of the sector regions.

14. The nonvolatile semiconductor memory device as defined by claim 1, wherein each of the first and second nonvolatile memory cells includes an ONO film formed of an oxide film (O), a nitride film (N) and an oxide film (O), as a charge trap site.

* * * * *